(12) United States Patent
Mitsutani

(10) Patent No.: US 6,356,612 B1
(45) Date of Patent: Mar. 12, 2002

(54) CLOCK SIGNAL REPRODUCING APPARATUS

(75) Inventor: Naoki Mitsutani, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/203,320

(22) Filed: Dec. 1, 1998

(30) Foreign Application Priority Data

Dec. 2, 1997 (JP) ............................... 9-348518

(51) Int. Cl.$^7$ ........................... H03D 3/24; H03D 3/18; H03L 7/06
(52) U.S. Cl. .................. 375/376; 375/327; 327/147
(58) Field of Search ................................. 375/376, 373, 375/375, 327, 294, 362; 329/325; 327/147, 156

(56) References Cited

U.S. PATENT DOCUMENTS 4,789,996 A * 12/1988 Butcher ...................... 375/376
5,598,396 A * 1/1997 Horibe et al. ............... 369/124

FOREIGN PATENT DOCUMENTS

JP 61-146031 7/1986
JP 7-193564 7/1995

OTHER PUBLICATIONS

Japanese Office Action issued Dec. 7, 1999 in a related application and English translation of relevant portions.

* cited by examiner

Primary Examiner—Chi Pham
Assistant Examiner—Khai Tran
(74) Attorney, Agent, or Firm—Ostrolenk, Farber, Gerb & Soffen, LLP

(57) ABSTRACT

Analog-to-digital converter 8 samples demodulated data signal 110 inputted from input terminal 14 in synchronism with clock signal 12 and converts the demodulated data signal into digital signal 9. Signal variation direction detection circuit 6 detects whether demodulated data signal 110 ascends or descends in one cycle of clock signal 12. Oscillator control circuit 10 supplies oscillator 4 with control voltage 5 corresponding to the amplitude of digital signal 9, and oscillator control circuit 10 switches whether to ascend or descend control voltage 5 as digital signal 9 increases on the basis of a variation direction signal 7. As a result, clock signal 12 generated by oscillator 4 has a frequency equal to the bit rate of demodulated data signal 110 and a phase fixed to demodulated data signal 110, and it is outputted from output terminal 122 as a clock signal reproduced from demodulated data signal 110.

6 Claims, 4 Drawing Sheets

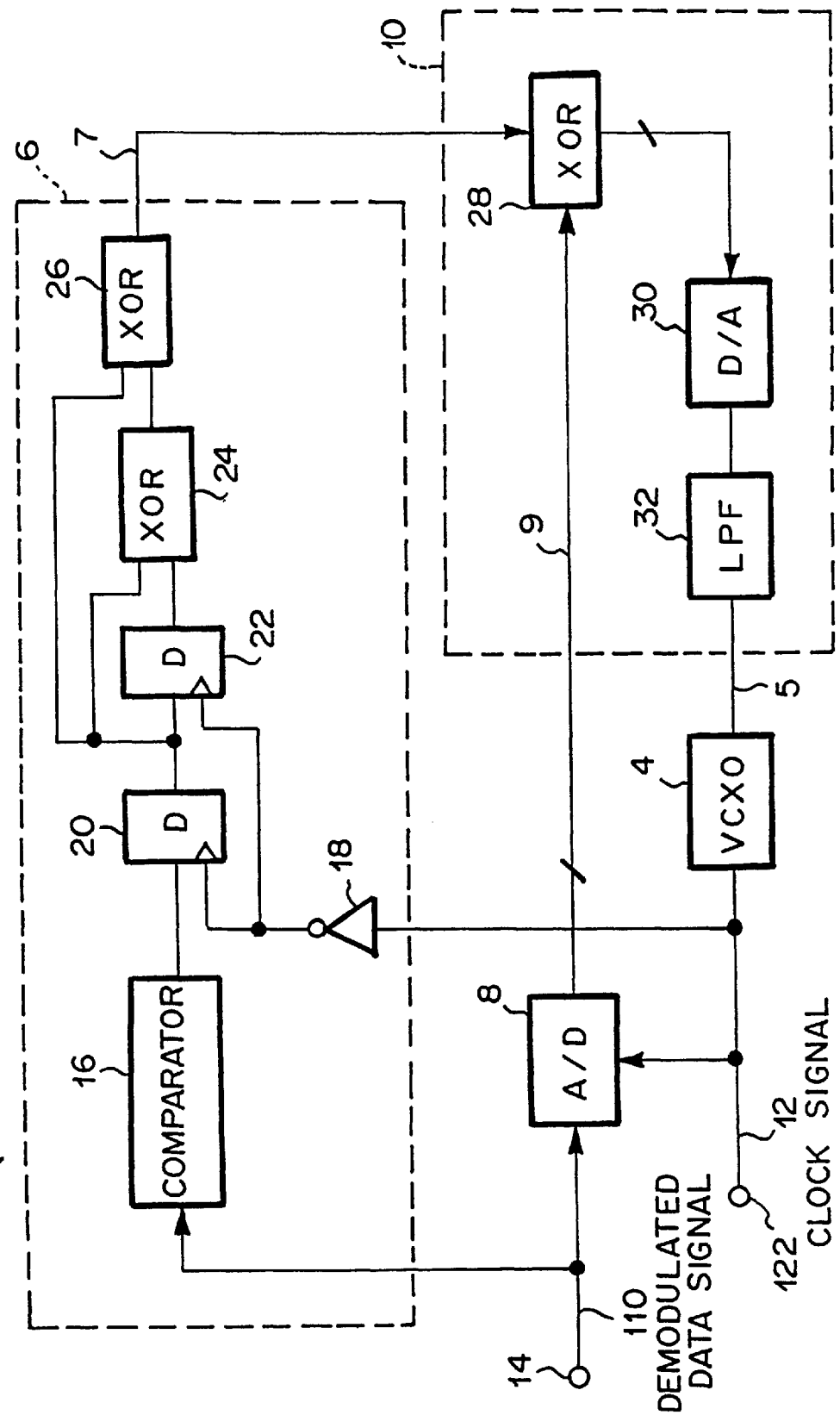

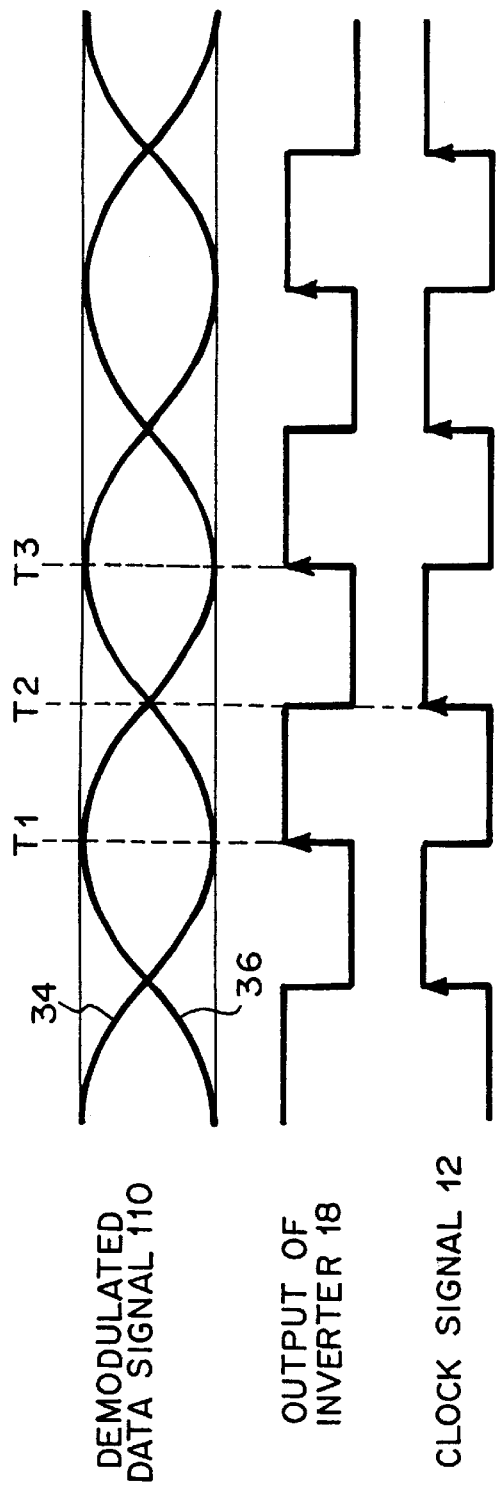
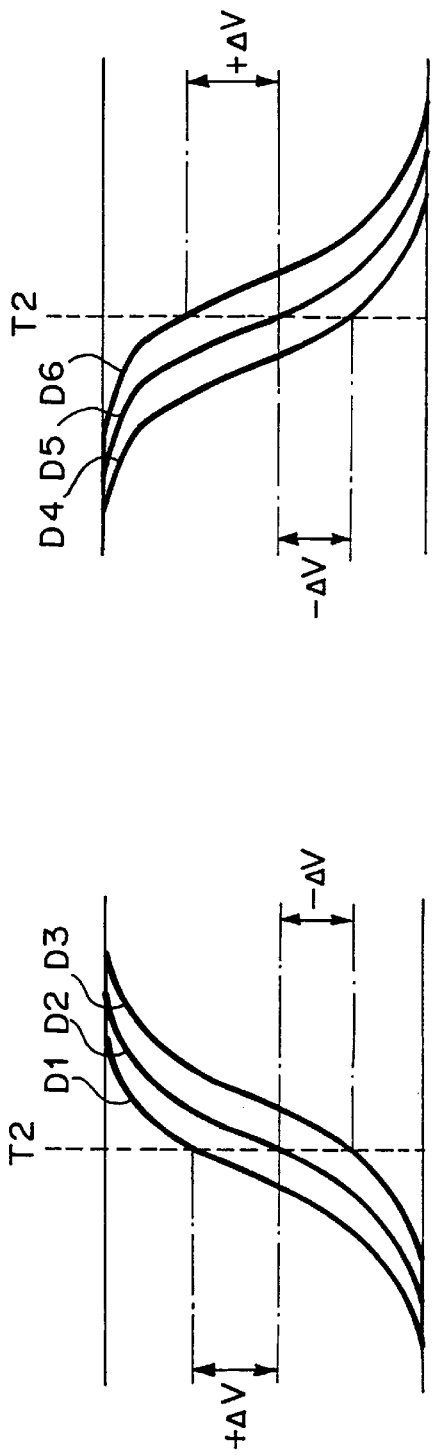

CLOCK SIGNAL REPRODUCING APPARATUS

BACKGROUND OF THE INVENTION

1. Field of the Invention

The present invention relates to a clock signal reproducing apparatus for reproducing a clock signal which is synchronized with a bit stream signal used for the reproduction.

2. Description of the Prior Art

For example, in a demodulator used for a satellite communication, a transmission signal is received and demodulated to obtain a demodulated data signal which is a bit stream signal, and then a clock signal which is synchronized with the demodulated data signal is first reproduced from the demodulated data signal. Thereafter, a write-in operation of the demodulated data signal into a memory and a code error correction processing for the demodulated data signal are carried out by using the clock signal thus reproduced.

FIG. 6 is a timing chart showing an example of the demodulated data signal.

The demodulation data signal has a still more gentle waveform as compared with the waveform of a bit stream signal before transmission as shown in FIG. 6, because the frequency band of a transmission channel is limited, and the clock signal is reproduced from such a demodulated data signal. In the bit stream signal before transmission, the low level represents that the bit value is equal to zero, and the high level represents that the bit value is equal to 1. Accordingly, the bit stream signal shown in FIG. 6 has the bit value which is alternately changed between "0" and "1".

Various methods for reproducing a clock signal have been hitherto proposed. A method of sampling and digitizing a demodulated data signal with an analog-to-digital converter while adjusting a sampling timing with a PLL (Phase Lock Loop) to obtain a clock signal has been most widely used.

FIG. 4 is a block diagram showing a clock signal reproducing apparatus based on a conventional system, and FIG. 5 is a timing chart showing the operation of the clock signal reproducing apparatus shown in FIG. 4.

In FIG. 4, oscillator 102 (VCXO) generates clock signal 104 whose frequency is varied in accordance with a control voltage, and supplies the clock signal as a sampling clock to analog-to-digital converter 106. The frequency of clock signal 104 generated by oscillator 102 is about twice as high as the bit rate of the demodulated signal inputted through input terminal 110. Analog-to-digital converter 106 samples demodulated data signal 110 from input terminal 110 at the rise-up time of the clock signal supplied from oscillator 102 to convert demodulated data signal 110 to a digital signal.

The normal demodulated data signal has a bit-value variation different from the signal of FIG. 6 in which the bit value is alternately changed between "1" and "0", and the arrangement of the bit values of the normal demodulated data signal is varied in accordance with the data content. Accordingly, FIG. 5 shows demodulated data signal 110 in order to explain the variation of the bit-value arrangement.

Data variation direction detector 112 outputs a logic signal representing the variation direction of demodulated data signal 110 on the basis of the most significant bit (MSB) of the output signal of analog-to-digital converter 106. Particularly, in FIG. 5, data variation direction detector 112 checks the output signal of analog-to-digital converter 106 at every other rise-up timing A of clock signal 104. When demodulated data signal 110 becomes higher during the period of one bit of the demodulated data signal (or during the period of two waves of clock signal 104), for example, the variation direction detection signal of the logic "0" is outputted from data variation direction detector 112. On the other hand, when demodulated data signal 110 becomes lower during the period of one bit of demodulated data signal 110, for example, the variation direction detection signal of the logic "1" is outputted from data variation direction detector 112.

Phase error detector 114 outputs a signal representing the amount of the phase error between demodulated data signal 110 and clock signal 104 on the basis of the output signal of analog-to-digital converter 106 at the timing B (the rise-up timing at the middle between timing A and timing A') as shown in FIG. 5.

Particularly, multiplier 116 (XOR) comprises an exclusive OR circuit, and it exclusively ORs the output signal of data variation direction detector 112 and the output signal of phase error detector 114 and outputs the signal representing the exclusive OR result. Digital-to-analog converter 118 converts the output signal of multiplier 116 to an analog signal, and low-pass filter 120 (LPF) allows only low-frequency band components to pass therethrough and supplies the components as a control voltage to oscillator 102.

Accordingly, when there is a phase difference between demodulated data signal 110 and clock signal 104, oscillator 102 is supplied with the control voltage to vary the frequency of clock signal 104 so that the frequency of clock signal 104 is increased/decreased in accordance with the variation direction signal outputted from the data variation direction detection circuit. As a result, the phase difference between demodulated data signal 110 and clock signal 104 disappears, so that clock signal 105 whose frequency corresponds to the bit rate of demodulated signal 110 and whose phase is fixed with respect to that of demodulated data signal 110 is obtained from half-frequency divider 121 and outputted from output terminal 122 as a reproduced clock signal.

As explained above, in the conventional clock reproducing system, the sampling must be carried out at the frequency which is twice as high as the bit rate of demodulated data signal 110 in analog-to-digital converter 106. Therefore, for example, when demodulated data signal 110 is high-speed data having a bit rate of 100 Mbps or more, the operation speed of analog-to-digital converter 106 must be set to twice of the bit rate (i.e., the operation speed must be 200 MHz or more), and thus a very expensive analog-to-digital converter having a large power consumption must be used. Further, likewise, an oscillator which can oscillate at 200 MHz or more must be used as oscillator 102. Therefore, as in the case of analog-to-digital converter 106, very expensive oscillator having a large power consumption power must be used.

Therefore, when the demodulated data signal is of high-speed data having a bit rate of 100 Mbps or more, it is actually difficult to implement a practical clock signal reproducing apparatus by the conventional system.

SUMMARY OF THE INVENTION

In order to overcome the aforementioned disadvantages, the present invention has been made and accordingly has an object to provide a clock signal reproducing device in which both of the operation speed of a needed analog-to-digital converter and the oscillation frequency of a needed oscillator can be decreased to a half of the prior art.

According to an aspect of the present invention, there is provided a clock signal reproducing apparatus for reproducing a clock signal from a received bit stream signal, which comprises: an oscillator for generating the clock signal having a frequency which is substantially the same as the bit rate of the bit stream signal and varies in accordance with a control voltage applied thereto; a signal variation direction detection circuit for detecting whether an amplitude of the bit stream signal is increased or decreased during one period of the clock signal and outputting a variation direction signal representing a result of the detection; an analog-to-digital converter for converting the bit stream signal to a digital signal in synchronism with the clock signal; and an oscillator control circuit for supplying said oscillator with the control voltage corresponding to a value of the digital signal and a value of the variation direction signal, wherein whether to ascend or descend the control voltage according to an increase in the value of the digital signal is determined by the oscillator control circuit on the basis of the value of the variation direction signal.

In the clock signal reproducing apparatus according to the present invention, the oscillator operates at the frequency substantially equal to the bit rate of the bit stream signal, and generates the clock signal whose frequency is varied in accordance with the control voltage supplied thereto. In synchronism with the clock signal, the signal variation direction detection circuit outputs a variation direction signal representing whether the amplitude of the bit stream signal is increased or decreased during one period of the clock signal generated by the oscillator.

The analog-to-digital converter samples the bit stream signal in synchronism with the clock signal, and converts the bit stream signal to the digital signal. The oscillator control circuit supplies the control voltage corresponding to the amplitude of the digital signal output from the analog-to-digital converter to the oscillator, and the operation of ascending the control voltage as the amplitude of the digital signal increases and the operation of reducing the control voltage as the amplitude of the digital signal increases are switched to each other on the basis of the variation direction signal outputted from the signal variation direction detection circuit.

As a result, the frequency of the clock signal generated by the oscillator is the frequency equal to the bit rate of the bit stream signal at all times, and the phase thereof is fixed to the bit stream signal.

In the clock signal reproducing apparatus, it is not required that the variation direction of the bit stream signal is detected on the basis of the digital signal output from the analog-to-digital converter as in the case of the prior art, and thus the analog-to-digital converter may be operated at a half of the frequency of the prior art. Accordingly, what is required for the oscillator is to generate the clock signal having a half of the frequency of the prior art.

BRIEF DESCRIPTION OF THE DRAWINGS

FIG. 1 is a block diagram showing a clock signal reproducing apparatus according to embodiment of the present invention;

FIG. 2 is a timing chart showing the operation of the clock signal reproducing apparatus shown in FIG. 1;

FIG. 3A is a graph showing the value of a digital signal outputted from an analog-to-digital converter under an ascending transient situation of a demodulated data signal; and FIG. 3B is a graph showing the value of a digital signal outputted from the analog-to-digital converter under a descending transient situation of the demodulated data signal;

DETAILED DESCRIPTION OF PREFERRED EMBODIMENT

Figure 4:
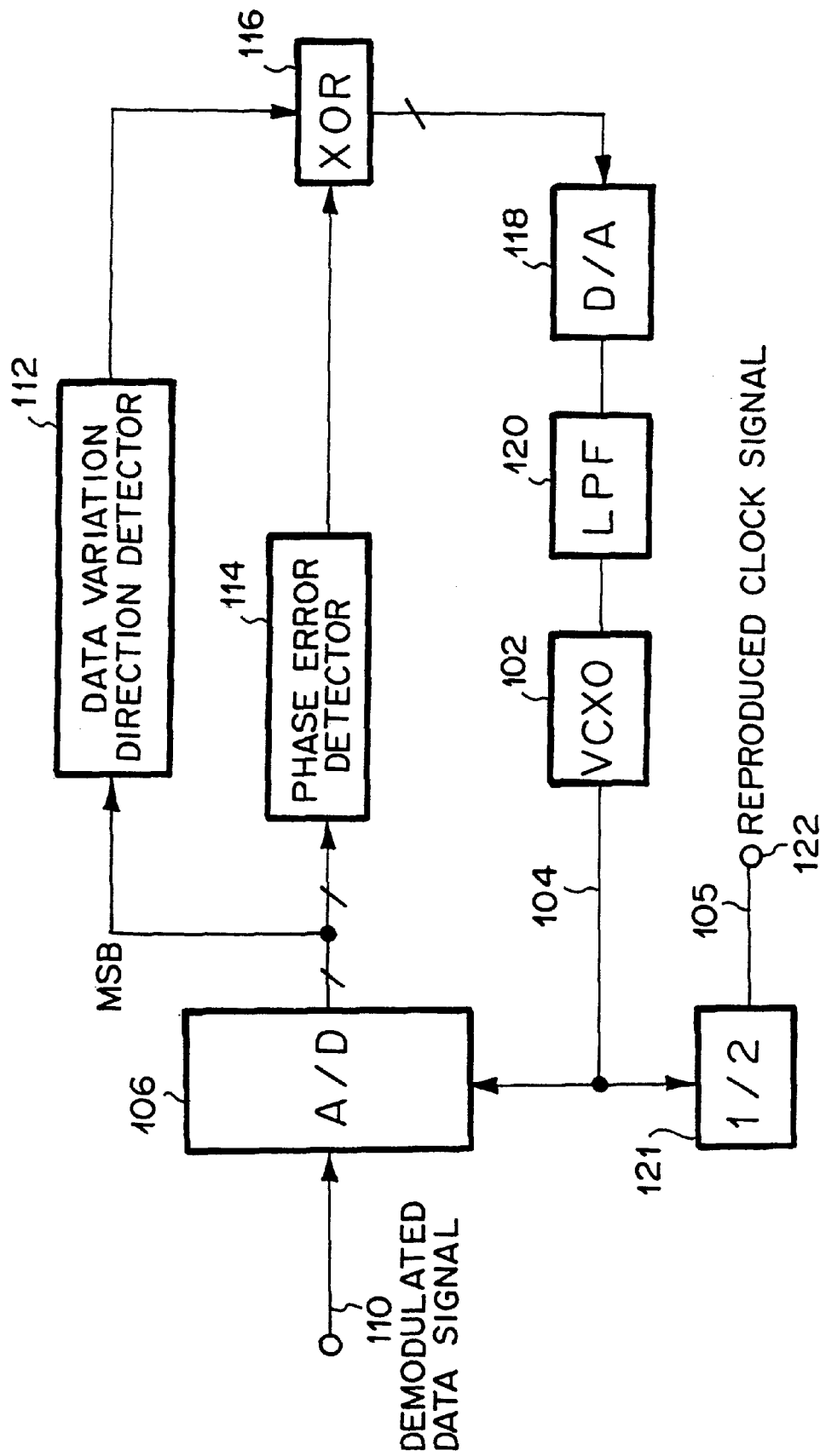
FIG. 4 is a block diagram showing a clock signal reproducing apparatus of the prior art.
Figure 5:
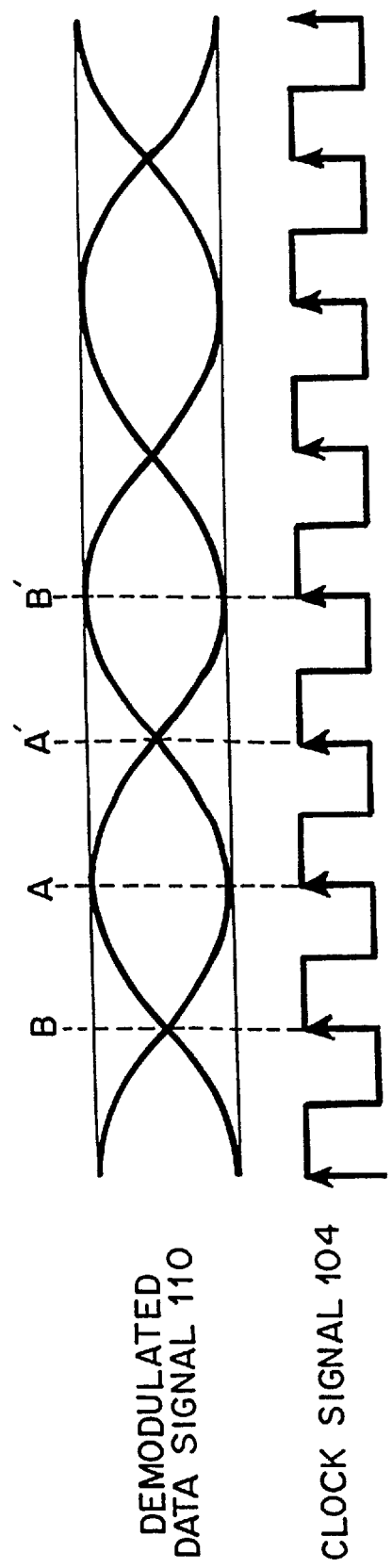
FIG. 5 is a timing chart showing the operation of a clock signal reproducing apparatus shown in FIG. 4.
Figure 6:
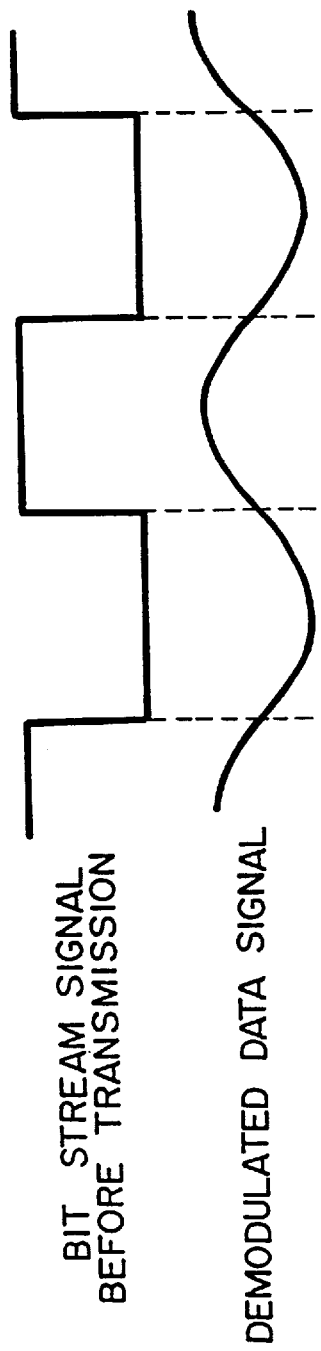
FIG. 6 is a timing chart showing an example of the demodulated data signal.

Preferred embodiment according to the present invention will be explained hereunder with reference to the accompanying drawings.

FIG. 1 is a block diagram showing a clock signal reproducing apparatus according to embodiment of the present invention, and FIG. 2 is a timing chart showing the operation of the clock signal reproducing apparatus of FIG. 1. Clock signal reproducing apparatus 2 constitutes a demodulator used for a satellite communication, and generates a clock signal synchronizing with demodulated data signal 110, i.e. a bit stream signal, obtained by receiving and demodulating a signal transmitted through satellite communication channel. Clock signal reproducing apparatus 2 comprises oscillator 4 (VCXO), signal variation direction detection circuit 6, analog-to-digital converter 8 (A/D) and oscillator control circuit 10.

Oscillator 4 comprises a voltage-controlled quartz oscillator, and generates clock signal 12 whose frequency substantially corresponds to the bit rate of demodulated data signal 110 and varies in accordance with given control voltage 5 and in which the time period of logic "1" and the time period of logic "0" in one period are substantially equal to each other. More particularly, when control voltage 5 is positive, oscillator 4 makes the frequency of clock signal 12 higher in accordance with the magnitude of the voltage. On the other hand, when control voltage 5 is negative, oscillator 4 makes the frequency of clock signal 12 lower in accordance with the magnitude of the voltage.

In synchronism with clock signal 12, signal variation direction detection circuit 6 outputs variation direction signal 7 representing whether the amplitude of demodulated data signal 110 inputted through input terminal 14 is increased or decreased during one period of clock signal 12.

Analog-to-digital converter 8 samples demodulated data signal 110 inputted through input terminal 14 in synchronism with clock signal 12, and converts demodulated data signal 110 into digital signal 9. Oscillator control circuit 10 supplies oscillator 4 with control voltage 5 corresponding to the amplitude of digital signal 9 outputted from analog-to-digital converter 8. Oscillator control circuit 10 switches whether to ascend or descend control voltage 5 as the value of digital signal 9 increases on the basis of variation direction signal 7.

Signal variation direction detection circuit 6, more particularly, comprises comparator 16, inverter 18, first and second latches 20, 22 (D), and first and second exclusive OR circuits 24, 26 (XOR).

Comparator 16 outputs a logical signal representing whether a level of demodulated data signal 110 is above a predetermined level or not, and in this embodiment, comparator 16 outputs a logical signal representing whether a level of demodulated data signal 110 is above the intermediate value between the maximum value and the minimum value of demodulated data signal 110. First latch 20 samples an output signal of comparator 16 in synchronism with a rising edge of clock signal 12 which is inverted by the inverter 18, and second latch 22 samples an output signal of first latch 20 in synchronism with a rising edge of clock signal 12 which is inverted by inverter 18.

Further, first exclusive OR circuit 24 performs exclusive OR between output signals of first and second latches 20 and 22, and second exclusive OR circuit 26 performs exclusive OR between output signals of first latch 20 and first exclusive OR circuit 24. An output signal of second exclusive OR circuit 26 (i.e., variation direction signal 7) is outputted to oscillator control circuit 10.

Oscillator control circuit 10 comprises third exclusive OR circuit 28 (XOR), digital-to-analog converter 30 (D/A) and low-pass filter 32 (LPF).

Third exclusive OR circuit 28 performs exclusive OR between each bit of output signal 9 of analog-to-digital converter 8 and variation direction signal 7, and digital-to-analog converter 30 converts an output signal of third exclusive OR circuit 28 into an analog signal. Low-pass filter 32 allows only low frequency-band components of an output signal of digital-to-analog converter 30 to pass therethrough, and outputs the components as control voltage 5 to oscillator 4.

Next, the operation of clock signal reproducing apparatus 2 thus constructed will be explained with reference to FIG. 2.

The timing chart of FIG. 2 shows a case where clock signal 12 and demodulated data signal 110 are in synchronization with each other. When demodulated data signal 110 and clock signal 12 are out of synchronization, the rise-up timing of clock signal 12 and the timing of the cross point between sinusoids 34 and 36 of which both represent demodulated data signal 110 are displaced from each other.

First, signal variation direction detection circuit 6 generates variation direction signal 7 representing whether demodulated data signal 110 is increased or decreased during one period of clock signal 12 as follows:

Comparator 16 compares a level of demodulated data signal 110 inputted through input terminal 14 with the intermediate value between the maximum and minimum values thereof. If the level of demodulated data signal 110 is higher than the intermediate value, comparator 16 outputs a signal of logic "1". On the other hand, if the level of demodulated data signal 110 is lower than the intermediate value, comparator 16 outputs a signal of logic "0".

First latch 20 samples and holds an output signal of comparator 16 at a rising edge of the inverted clock signal outputted from inverter 18 (i.e., at a falling edge of clock signal 12) and second latch 22 samples and holds an output signal of first latch 20 at the same timing. Accordingly, second latch 22 holds an output signal of comparator 16 which is preceding to the latest output signal held in first latch 20 by one clock. For example, when first latch 20 holds the output signal (the latest output signal) of comparator 16 at the timing T3 in FIG. 2, second latch 22 holds the just-preceding output signal of comparator 16, i.e., the output signal of comparator 16 which is just preceding to the output signal of comparator 16 at the timing T3 by one clock, that is, second latch 22 holds the output signal of comparator 16 at the timing T1.

First exclusive OR circuit 24 performs exclusive OR on output signals of first and second latches 20 and 22, that is, on the latest output signal of comparator 16 and the output signal of comparator 16 which is preceding to the latest output signal by one clock. Therefore, XOR 24 outputs the logic "1" signal only when a logical value of the latest output signal of comparator 16 is different from a logical value of the just-preceding output signal of comparator 16 which has been held since one clock before, that is, only when an output signal of comparator 16 is varied during the period of one clock of clock signal 12. That is, first exclusive OR circuit 24 outputs the logic "1" in the cases 1 and 2 shown in the following table [1], and outputs the logic "0" in the other cases.

TABLE 1

| CASE | OUTPUT OF COMPARATOR BEFORE ONE CLOCK | LATEST OUTPUT OF COMPARATOR |
|------|---------------------------------------|-----------------------------|
| 1    | 0                                     | 1                           |
| 2    | 1                                     | 0                           |

Second exclusive OR circuit 26 performs exclusive OR on an output signal of first exclusive OR circuit 24 and an output signal of first latch 20. Therefore, it outputs an output signal of first exclusive OR circuit 24 directly when an output signal of first latch 20 is logic "0", however, it inverts an output signal of first exclusive OR circuit 24 and then output the inverted output signal when an output signal of first latch 20 is logic "1".

Accordingly, when an output signal of comparator 16 varies during a period of clock signal 12 and the latest value is logic "1", second exclusive OR circuit 26 outputs a signal of logic "0" as variation direction signal 7. On the other hand, when an output signal varies during a period of clock signal 12 and the latest value is logic "0", second exclusive OR circuit 26 outputs a signal of logic "1" as variation direction signal 7.

That is, the signal variation direction detection circuit 6 outputs variation direction signal 7 as follows:

(1) variation direction signal 7 of the logic "0" when an output signal of comparator 16 varies from logic "0" to logic "1" during a period of clock signal 12; and (2) variation direction signal 7 of logic "1" when an output signal of comparator 16 varies from logic "1" to logic "0" during a period of clock signal 12.

Next, the operation of analog-to-digital converter 8 will be explained.

Analog-to-digital converter 8 samples demodulated data signal 110 inputted through input terminal 14 in synchronism with clock signal 12, more particularly, at a rising edge of clock signal 12, and converts demodulated data signal 110 to digital signal 9 as shown in FIG. 2. Here, analog-to-digital converter 8 performs analog-to-digital conversion on the basis of the intermediate value between the maximum and minimum values of demodulated data signal 110, and thus it outputs digital signal 9 having a positive value when the value of demodulated data signal 110 is larger than the intermediate value while it outputs digital signal 9 having a negative value when the value of demodulated data signal 110 is smaller than the intermediate value. In addition, when the value of demodulated data signal 110 is equal to the intermediate value, analog-to-digital converter 8 outputs digital signal 9 having a value of zero.

FIG. 3A is a diagram showing values of digital signal 9 outputted from analog-to-digital converter 8 in such a case where demodulated data signal 110 is ascending, and FIG. 3B is a diagram showing values of digital signal 9 outputted from analog-to-digital converter 8 in such a case where demodulated data signal 110 is descending. In FIGS. 3A and 3B, timing T2 corresponds to the rise-up timing of clock signal 12 as shown in FIG. 2, and analog-to-digital converter 8 samples demodulated data signal 110 at this timing T2.

In FIG. 3A, demodulated data signal D2 is in synchronism with clock signal 12 in phase, and it has the intermediate value at time T2. Therefore, a value of digital signal 9 outputted from analog-to-digital converter is equal to zero at time T2. On the other hand, demodulated data signal D1 leads clock signal 12 in phase, and an output of analog-to-digital converter 8 at time T2 is positive (+ΔV). Further, demodulated data signal D3 lags clock signal 12 in phase, and an output of analog-to-digital converter 8 at time T2 is negative (−ΔV).

In FIG. 3B, demodulated data signal D5 is in synchronism with clock signal 12 in phase, and it has the intermediate value at time T2. Therefore, a value of digital signal 9 outputted from analog-to-digital converter is equal to zero at time T2. On the other hand, demodulated data signal D4 leads clock signal 12 in phase, and an output of analog-to-digital converter 8 at time T2 is negative (−ΔV). Further, demodulated data signal D6 lags clock signal 12 in phase, and an output of analog-to-digital converter 8 at time T2 is positive(+ΔV).

Next, the operation of oscillator control circuit 10 will be explained.

Third exclusive OR circuit 28 constituting oscillator control circuit 10 performs exclusive OR between each bit of output signal 9 of analog-to-digital converter 8 and variation direction signal 7. Accordingly, digital signal 9 from analog-to-digital converter 8 is outputted from third exclusively OR circuit 28 with its sign being kept when variation direction signal 7 is logic "0". On the other hand, when variation direction signal 7 is logic "1", the digital signal 9 is outputted from third exclusive OR circuit 28 with its sign being inverted.

Accordingly, in the case of FIG. 3A, digital signal 9 from analog-to-digital converter 8 is directly outputted, and in the case of FIG. 3B, digital signal 9 from analog-to-digital converter 8 is outputted while the sign thereof is inverted.

Digital-to-analog converter 30 converts an output signal of third exclusive OR circuit 28 to an analog signal, and low-pass filter 32 allows only low frequency band components of an output signal of digital-to-analog converter 30 to pass therethrough and outputs these components as control voltage 5 to oscillator 4.

Next, the overall operation will be explained.

First, the case where demodulated data signal 110 is under the ascending situation in the neighborhood of a rising edge of clock signal 12 as shown in FIG. 3A will be explained.

In this case, demodulated data signal 110 is ascending at time T2 of FIG. 2, and thus variation direction detection circuit 6 outputs variation direction signal 7 of logic "0" at time T3. Therefore, when demodulated data signal 110 leads clock signal 12 as in the case of demodulated data signal D1 shown in FIG. 3A, oscillator control circuit 10 supplies positive control voltage 5 to oscillator 4 at time T3. As a result, oscillator 4 makes the frequency of clock signal 12 higher in accordance with the magnitude of control voltage 5, and thus the phase of clock signal 12 is advanced and approaches to the phase of demodulated data signal D1. On the other hand, when demodulated data signal 110 lags clock signal 12 in phase as in the case of demodulated data signal D3 shown in FIG. 3A, oscillator control circuit 10 supplies negative control voltage 5 to oscillator 4. As a result, oscillator 4 makes the frequency of clock signal 12 lower in accordance with the magnitude of control voltage 5, and thus the phase of clock signal 12 is delayed and approaches to the phase of demodulated data signal D3.

Next, the case where demodulated data signal 110 is under the descending situation in the neighborhood of a rising edge of clock signal 12 as shown in FIG. 3B will be explained.

In this case, demodulated data signal 110 is descending at time T2 in FIG. 2, and thus variation direction detection circuit 6 outputs variation direction signal 7 of logic "1" at time T3. Therefore, when demodulated data signal 110 leads clock signal 12 as in the case of demodulated data signal D4, oscillator control circuit 10 supplies positive control voltage 5 to oscillator 4 at time T3. As a result, oscillator 4 makes the frequency of clock signal 12 higher in accordance with the magnitude of control voltage 5, and thus phase of the clock signal 12 is advanced and approaches to the phase of demodulated data signal D4. On the other hand, when demodulated signal 110 lags clock signal 12 as in the case of demodulated data signal D6, oscillator control circuit 10 supplies negative control voltage to oscillator 4. As a result, oscillator 4 makes the frequency of clock signal 12 lower in accordance with the magnitude of control voltage 5, and thus the phase of clock signal 12 is delayed and approaches to the phase of demodulated data signal D6.

Accordingly, the frequency of clock signal 12 generated by the oscillator 4 corresponds to the bit rate of demodulated data signal 110 at all times, and the phase thereof is fixed with respect to the bit stream of demodulated data signal 110. Such clock signal 12 generated by oscillator 4 is outputted from output terminal 122 as the clock signal which is reproduced from demodulated data signal 110.

In clock signal reproducing apparatus 2 of this embodiment, it is unnecessary to detect a variation direction of demodulated data signal 110 on the basis of a digital signal outputted from analog-to-digital converter 8 as in the case of the prior art, so that analog-to-digital converter 8 may be operated at a half of the frequency of the prior art, and thus what is required for oscillator 4 is to generate clock signal 12 having a half of the frequency of the prior art. Therefore, even when demodulated data signal 110 is a high-speed data signal having a bit rate of 100 Mbps or more, it is unnecessary to use a specially high-performance analog-to-digital converter and oscillator as analog-to-digital converter 8 and ascillator 4, so that practical clock signal reproducing apparatus 2 can be fabricated.

The present invention is not limited to the above embodiment, and various modifications may be made. For example, in place of the voltage-controlled quartz oscillator, a normal voltage controlled oscillator may be used as oscillator 4 to cope with demodulated data signals of higher frequencies.

As explained above, according to the clock signal reproducing apparatus of the present invention, the oscillator is operated at the frequency which is substantially the same as the bit rate of the bit stream signal, and generates a clock signal whose frequency varies in accordance with a given control voltage. In synchronism with the clock signal, the signal variation direction detection circuit outputs the variation direction signal which represents whether the amplitude of the bit stream signal is increased or decreased during one period of the clock signal generated by the oscillator.

Further, the analog-to-digital converter samples the bit stream signal in synchronism with the clock signal, and converts the bit stream signal to a digital signal. The oscillator control circuit supplies the oscillator with a control voltage corresponding to the magnitude of the digital signal outputted from the analog-to-digital converter, and switches whether to ascend or descend the control voltage as the value of the digital signal increases on the basis of a variation direction signal outputted from the signal variation direction detection circuit.

As a result, the frequency of the clock signal generated by the oscillator corresponds to the bit rate of the demodulated data signal at all times, and the phase thereof is fixed with respect to the bit stream of the demodulated data signal.

As explained above, according to the clock signal reproducing apparatus, it is unnecessary to detect the variation direction of the bit stream signal on the basis of the digital signal outputted from the analog-to-digital converter as in the case of the prior art. Therefore, the analog-to-digital converter may operate at a half of the frequency of the prior art, and thus what is required for the oscillator is to generate the clock signal having a half of the frequency of the prior art. Therefore, even when the demodulated data signal is a high-speed data signal having a bit rate of 100 Mbps or more, it is unnecessary to use a special high-performance analog-to-digital converter and oscillator, and a practical clock signal reproducing apparatus can be fabricated.

What is claimed is:

1. A clock signal reproducing apparatus for reproducing a clock signal from a received bit stream signal, which comprises:

an oscillator for generating the clock signal having a frequency which is substantially the same as the bit rate of the bit stream signal and varies in accordance with a control voltage applied thereto;

a signal variation direction detection circuit for detecting whether an amplitude of the bit stream signal is increased or decreased during one period of the clock signal and outputting a variation direction signal representing a result of the detection;

an analog-to-digital converter for converting the bit stream signal to a digital signal in synchronism with the clock signal; and an oscillator control circuit for supplying said oscillator with the control voltage corresponding to a value of the digital signal and a value of the variation direction signal, wherein whether to ascend or descend the control voltage according to an increase in the value of the digital signal is determined by the oscillator control circuit on the basis of the value of the variation direction signal.

2. The clock signal reproducing apparatus as set forth in claim 1, wherein said signal variation direction detection circuit comprises:

a comparator for outputting a logic signal representing whether a value of the bit stream signal is above a threshold or not;

a first latch for sampling and latching the logic signal in synchronism with the clock signal;

a second latch for sampling and latching an output signal of said first latch in synchronism with the clock signal;

a first exclusive OR circuit for performing exclusive OR between output signals of said first and second latches; and a second exclusive OR circuit for performing exclusive OR between output signals of said first latch and said first exclusive OR circuit, wherein an output signal of said second exclusive OR circuit is outputted as the variation direction signal.

3. The clock signal reproducing apparatus as set forth in claim 2, wherein said analog-to-digital converter samples the bit stream signal at a rising or falling edge of the clock signal, and said first and second latches sample their respective input signals at a falling or rising timing of the clock signal complimentarily to said analog-to-digital converter.

4. The clock signal reproducing apparatus as set forth in claim 1, wherein said oscillator control circuit comprises a third exclusive OR circuit for performing exclusive OR between each bit of the digital signal outputted from said analog-to-digital converter and the variation direction signal, a digital-to-analog converter for converting an output signal of said third exclusive OR circuit to an analog signal, and a low-pass filter for allowing only low frequency band components of the analog signal outputted from said digital-to-analog converter to pass therethrough and outputting the components as the control voltage to said oscillator.

5. The clock signal reproducing apparatus as set forth in claim 1, wherein said oscillator comprises a voltage controlled quartz oscillator or a voltage control oscillator.

6. The clock signal reproducing apparatus as set forth in claim 1, wherein the bit stream signal is a signal obtained by demodulating a signal received from a satellite communication channel.

* * * * *